(12) United States Patent
Wu et al.

(10) Patent No.: US 6,432,772 B1
(45) Date of Patent: Aug. 13, 2002

(54) METHOD OF FORMING A LOWER STORAGE NODE OF A CAPACITOR

(75) Inventors: King-Lung Wu, Chia-Li; Kun-Chi Lin, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,402

(22) Filed: Aug. 30, 2001

(51) Int. Cl.[7] .......................................... H01L 21/8242
(52) U.S. Cl. ........................ 438/255; 438/398; 438/964
(58) Field of Search ................................ 438/255, 398, 438/964

(56) References Cited

U.S. PATENT DOCUMENTS

| | | | | |
|---|---|---|---|---|
| 5,937,314 A | * | 9/1999 | Ping et al. | 438/486 |
| 5,963,805 A | * | 10/1999 | Kang et al. | 438/255 |
| 6,037,219 A | * | 3/2000 | Lin et al. | 438/255 |
| 6,046,083 A | * | 4/2000 | Lin et al. | 438/255 |
| 6,090,679 A | * | 7/2000 | Lou | 438/396 |
| 6,121,084 A | * | 9/2000 | Coursey | 438/239 |
| 6,174,769 B1 | * | 1/2001 | Lou | 438/253 |

* cited by examiner

Primary Examiner—John F. Niebling
Assistant Examiner—Jennifer M. Kennedy
(74) Attorney, Agent, or Firm—Winston Hsu (57) ABSTRACT

An isolation layer is formed on a substrate of a semiconductor wafer. At least one recess is formed in the isolation layer by way of a photo-etching-process. A two stage in-situ doped deposition process is then performed to form a first doped amorphous silicon (α-Si) layer and a second doped amorphous silicon (α-Si) layer doping concentration of the second doped amorphous silicon (α-Si) layer being less than that of the first doped amorphous silicon layer. A dielectric layer is formed to fill the recess, and a planarization process removes portions of the second doped amorphous silicon layer, the first doped amorphous silicon layer and the dielectric layer on the surface of the isolation layer. Finally, the dielectric layer and the isolation layer are removed, and a hemi-spherical grain (HSG) process is performed to form a rough surface with a plurality of hemi-spherical grains on the surface of the second doped amorphous silicon layer.

9 Claims, 7 Drawing Sheets

METHOD OF FORMING A LOWER STORAGE NODE OF A CAPACITOR

BACKGROUND OF INVENTION

1. Field of the Invention

The present invention relates to a method for forming a lower storage node of a capacitor.

2. Description of the Prior Art

Dynamic random access memory (DRAM) is a collection of a large number of memory cells. Each memory cell comprises a metal oxide semiconductor (MOS) transistor and a capacitor in series. The capacitor design of the memory cell involves the formation of two node layers on a semiconductor wafer. One of the node layers is used as an upper field plate, and the other is used as a lower storage node. A cell dielectric layer is installed between them to isolate these two node layers. When a voltage is applied to one of the node layers, the voltage induces a corresponding charge on the other node layer. This charge is used to store and retrieve memory data.

Figure 1:
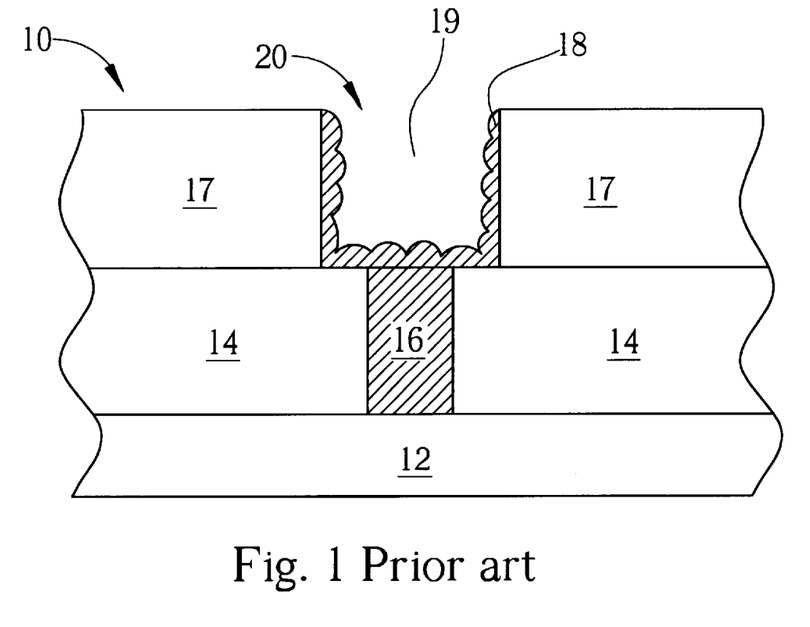
FIG. 1 is a schematic diagram for forming a lower storage node of a capacitor according to the prior art.

Please refer to FIG. 1. FIG. 1 is a schematic diagram for forming a lower storage node 20 of a stack crown capacitor on a semiconductor wafer 10 according to the prior art. The semiconductor wafer 10 comprises a substrate 12, an isolation layer 14 covering the substrate 12, and a conductive layer 16 installed in the isolating layer 14. The conductive layer 16 is made of doped polysilicon or amorphous silicon. The conductive layer 16 is used to electrically connect to a drain of the MOS transistor (not shown) on the substrate 12, serving as a node contact. The conductive layer 16 is level with the isolation layer 14.

In the prior art method of forming the lower storage node 20 of the capacitor, a dielectric layer 17 is formed on the isolating layer 14. A lithography process is then performed to define the position of the lower storage node 20 using a photoresist layer (not shown). A dry etching process is performed to remove the portion of the dielectric layer 17 that is not covered by the photoresist layer until the surface of the isolating layer 14 is reached, forming a vertical hole 19. Next, a low pressure chemical vapor deposition (LPCVD) process and a planarization process are performed to form an amorphous silicon ($\alpha$-Si) layer 18 (a portion of which is shown in FIG. 1) that covers the dielectric layer 17 and the walls and bottom of the hole 19 in order to form the initial lower storage node 20 of a capacitor in a memory cell.

Silane ($SiH_4$) and $SiH_2Cl_2$ (dichlorosiliane) gases are input for seedingin order to perform a hemi-spherical grain (HSG) process on the surface of the lower storage node 20. The HSG process is used to transform the surface of the lower storage node 20 into a rough surface having a plurality of hemispherical grains, thereby increasing the surface area of the lower storage node 20 to double the original surface area. An ion implantation process can be performed when forming the amorphous silicon layer 18, after completing the planarization process, or after the hemi-spherical process, in order to implant dopants into the surface of the amorphous silicon layer 18 for transformation into a doped amorphous silicon layer (doped $\alpha$-Si).

Figure 2:
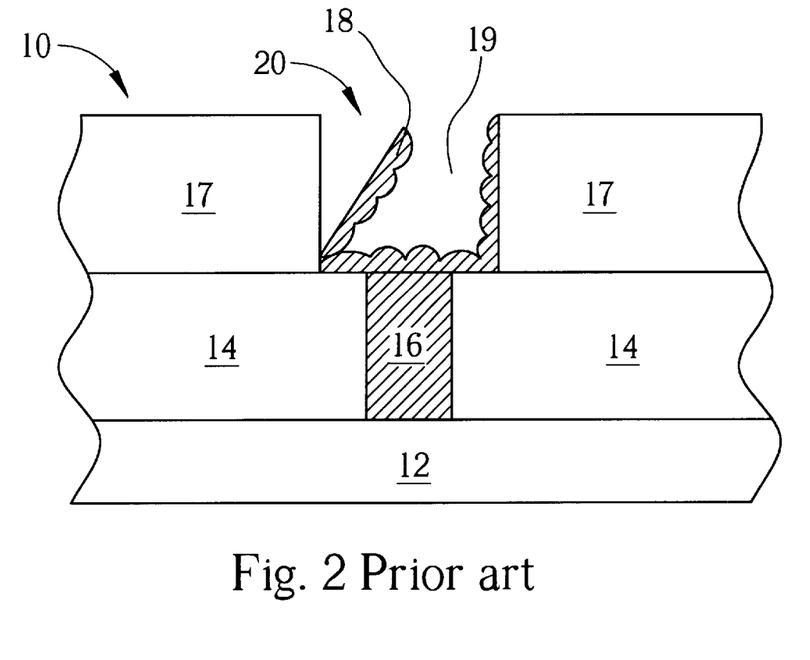
FIG. 2 is a schematic diagram of collapse of a lower storage node of a prior art capacitor.
Figure 3:
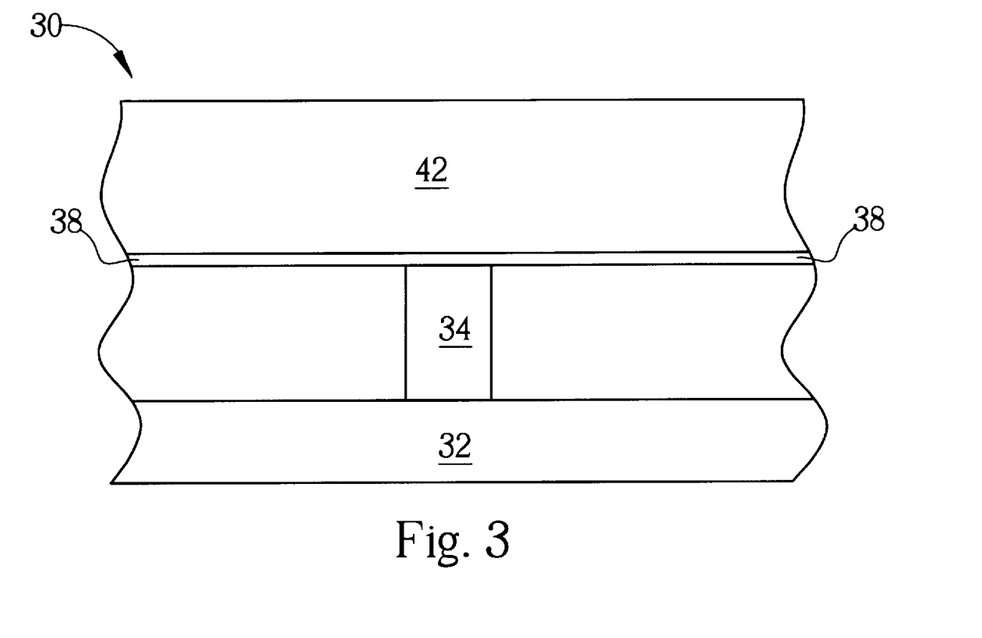
FIG. 3 to FIG. 8 are schematic diagrams for forming a lower storage node of a capacitor according to the first embodiment of the present invention.

Please refer to FIG. 2. FIG. 2 is a schematic diagram that shows a collapse of the lower storage node 20 of the prior art capacitor. Because the amorphous silicon layer of the lower storage node 20 of the capacitor has a crown structure on the dielectric layer 14, the thickness of the crown structure on the walls of the hole 19 is not large. Therefore, in subsequent semiconductor processes, especially in cleaning processes, the walls of the lower storage node 20 of the capacitor may easily collapse, which results in a reduced manufacturing yield.

SUMMARY OF INVENTION

It is therefore a primary objective of the present invention to provide a method of forming a lower storage node of a capacitor to solve the problem of collapse, and further to increase the surface area of the lower storage node of the capacitor.

In the preferred embodiment of the present invention, the method involves first forming an isolation layer on the substrate of a semiconductor wafer, then forming at least one recess in the isolation layer by utilizing a photo-etching-process. Thereafter, a two stage in-situ doped deposition process is performed in order to form a first doped amorphous silicon ($\alpha$-Si) layer and a second doped amorphous silicon ($\alpha$-Si) layer, with a doping concentration of the second doped amorphous silicon ($\alpha$-Si) layer being less than that of the first doped amorphous silicon layer. A dielectric layer is formed to fill the recess, and a planarization process is performed in order to remove portions of the second doped amorphous silicon layer, the first doped amorphous silicon layer and the dielectric layer on the surface of the isolation layer. Finally, the dielectric layer and the isolation layer are removed, and a hemi-spherical grain (HSG) process is performed to form a rough surface with a plurality of hemispherical grains on the surface of the second doped amorphous silicon layer.

It is a feature of the present invention that the lower storage node of the capacitor comprises a first doped amorphous silicon layer with a high dopant concentration, and a second doped amorphous silicon layer with a low dopant concentration. The thickness of the lower storage node of the capacitor can thereby be controlled effectively, so as to avoid collapsing of the walls of the lower storage node of the capacitor in subsequent processes. The contact area of the lower storage node is increased due to the HSG process. Also, the boundary of the field plate does not exceed the width of the recess, which shrinks the spacing between the capacitor and other devices, and enhances integration. Additionally, in another embodiment of the present invention, the contact area for the lower storage node can be increased greatly by making a three-layered structure, which increases the charge carrying capacity (i.e., capacitance) of the capacitor.

DETAILED DESCRIPTION

First Embodiment

Figure 4:
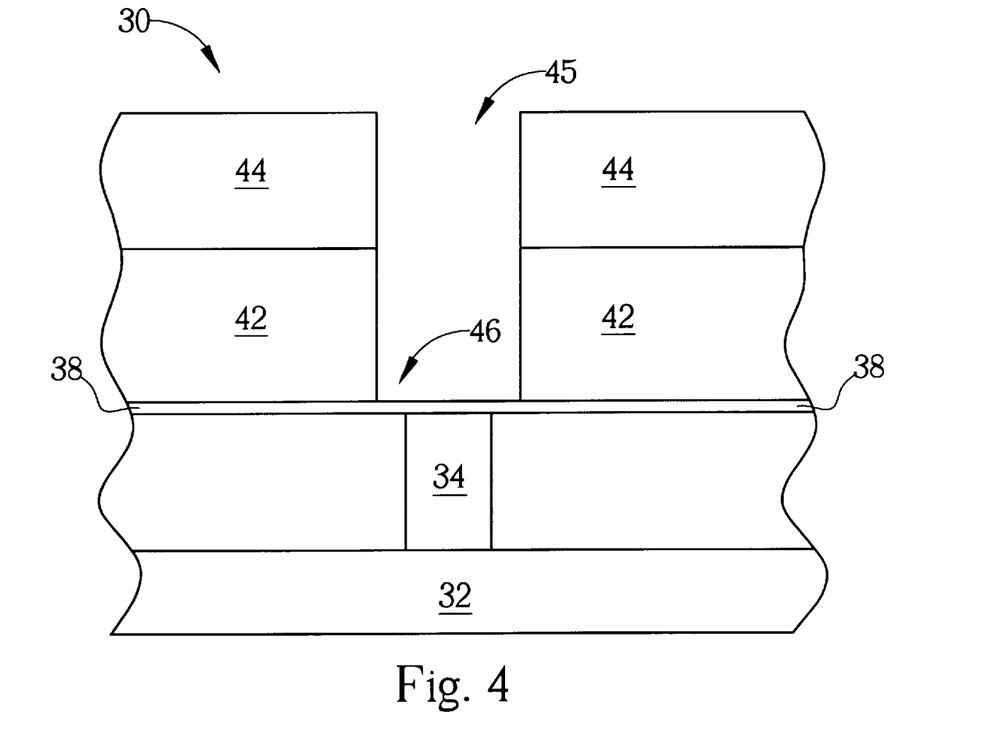

Please refer to FIG. 3 to FIG. 8. FIG. 3 to 8 are schematic diagrams for forming a lower storage node 30 of a capacitor according to the first embodiment of the present invention. The lower storage node 30 is formed on the surface of a substrate 32 of a semiconductor wafer 30. The surface of the substrate 32 comprises a conductive object 34, an etch stop layer 38, and an isolation layer 42 on the etch stop layer 38. The isolation layer 42 is usually composed of oxide, such as silicon dioxide ($SiO_2$). The etch stop layer 38 is a silicon nitride ($Si_3N_4$) layer, or a silicon oxy-nitride ($SiO_xN_y$) layer. The conductive layer 34 is a node contact, a landing pad or a source/drain of a transistor. As shown in FIG. 4, first a lithography process is performed in order to form a photoresist layer 44 on the surface of the isolation layer 42, and to form an opening 45 in the photoresist layer 44 within a predetermined area atop the conductive layer 34. Thereafter, a dry etching process is performed to vertically remove the isolation layer 42 beneath the opening 45, until reaching the etch stop layer 38, so as to form a vertical recess 46 reaching the surface of the conductive layer 34. When performing the dry etching process, the selectivity of the dry etching process can be adjusted so that the etch stop layer 38 on the surface of the bottom of the recess 46 is removed completely after the dry etching process. Alternatively, additional wet etching processes or cleaning processes after the dry etching process can be utilized in order to completely remove the etch stop layer 38 on the surface of the bottom of the recess 46.

Figure 5:
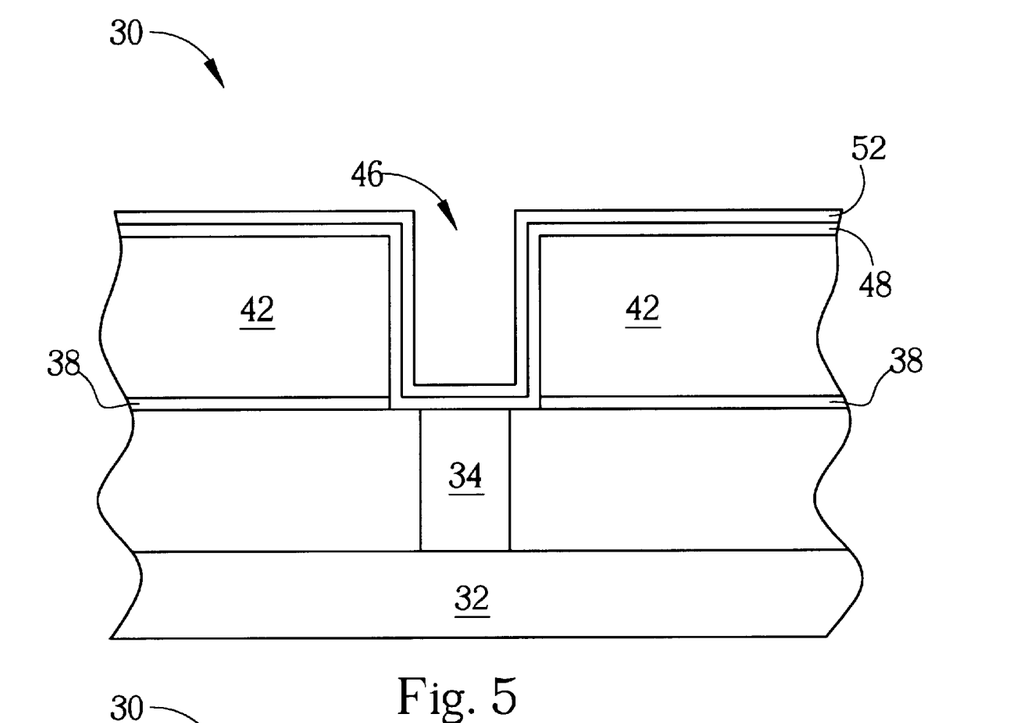

As shown in FIG. 5, a two-step in-situ doping deposition process is then performed after removing the photoresist layer 44. First, a low pressure chemical vapor deposition (LPCVD) process is utilized in order to perform the first step of the two-step in-situ doping deposition process. This first step deposits a required amorphous silicon layer ($\alpha$-Si) by heating and decomposing silane ($SiH_4$) at a temperature lower than 575° C., to form a first doped amorphous silicon layer 48 with a phosphorous (P) ion dopant concentration ranging from 2.5 to 3.0 E20/$cm^3$ on the surface of the isolation layer 42 and the recess 46. Thereafter, a low pressure chemical vapor deposition (LPCVD) process is utilized in order to perform the second step of the two-step in-situ doping deposition process. A required amorphous silicon layer ($\alpha$-Si) is deposited by heating and decomposing silane ($SiH_4$) at a temperature lower than 575° C., to form a second doped amorphous silicon layer 52 with a phosphorous (P) ion dopant concentration ranging from 1.2 to 1.7 E20/$cm^3$ on the surface of the first doped amorphous silicon layer 48. The dopant concentration of the second doped amorphous silicon layer 52 is thus less than the dopant concentration of the first doped amorphous silicon layer 48.

Figure 6:
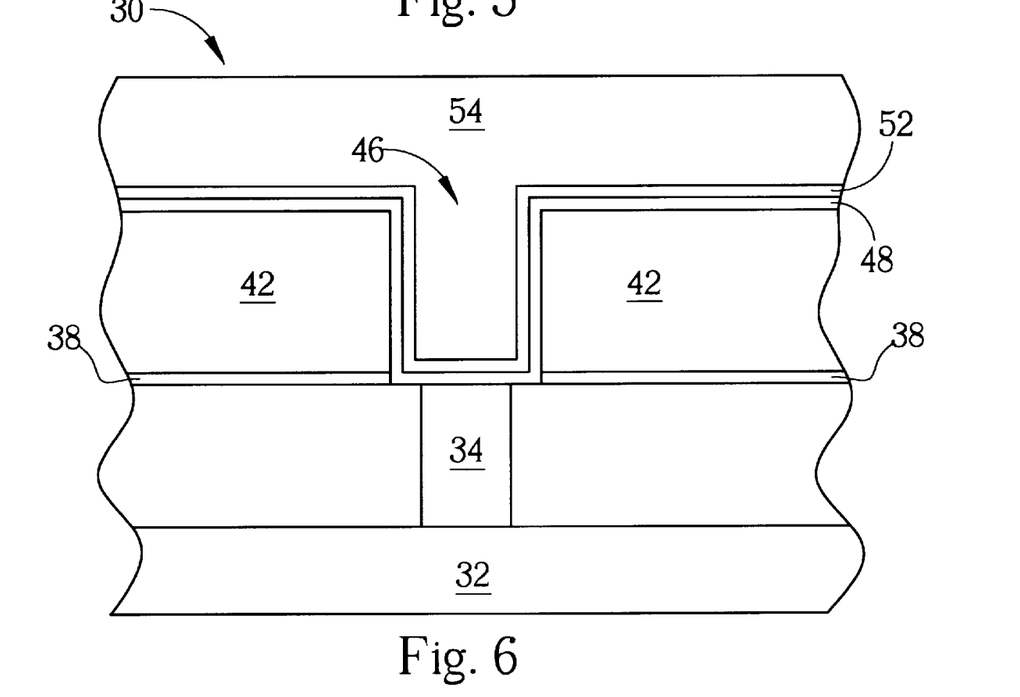

As shown in FIG. 6, a dielectric layer 54, composed of oxide, is the formed uniformly on the surface of the second doped amorphous silicon layer 52. A planarization process, such as a chemical mechanical polishing (CMP) process or an etch back process, is performed on the surface of the dielectric layer 54 in order to remove a portion of the second doped amorphous silicon layer 52, the first doped amorphous layer 48 and the dielectric layer 54 on the surface of the isolation layer 42. After the planarization process, the top surface of the dielectric layer 54 should be about even with the top surface of the isolation layer 42.

Figure 7:
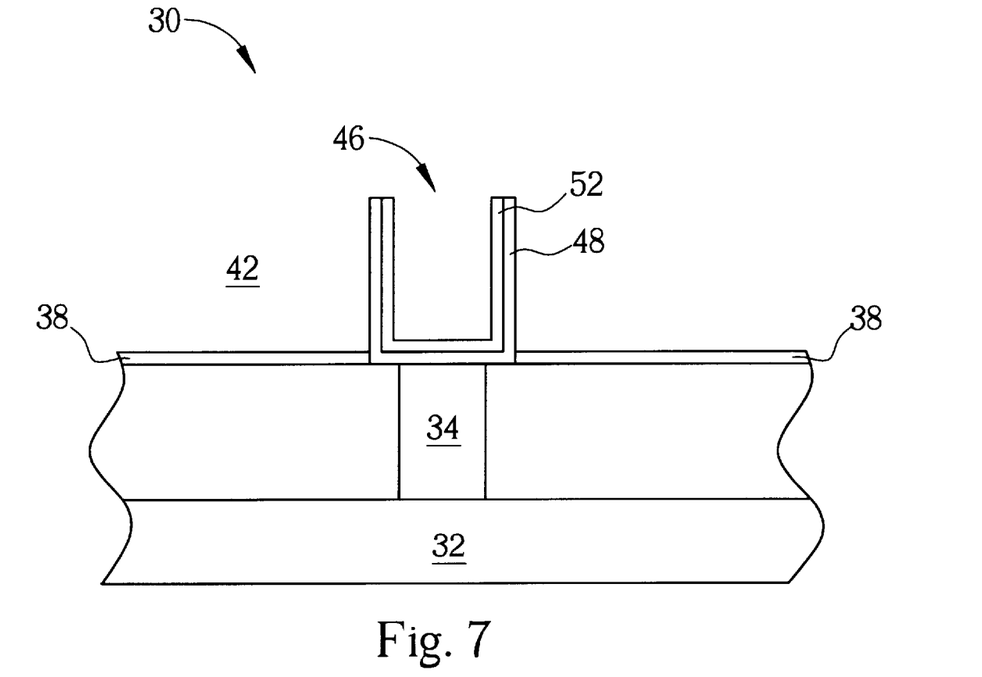

As shown in FIG. 7, a dry etching process is then performed after the planarization process so as to completely remove the dielectric layer 54 and the remaining isolation layer 42 in the recess 46. Since the dry etching process utilizes the etch stop layer 38 as an etch stop point, the selectivity for the etch stop layer 38 should be different from the selectivity for the isolation layer 42 by properly selecting the composition of the etch stop layer 38. The yield of the etching process may therefore be more accurately controlled, and situations of under-etching or over-etching will not occur. Alternatively, the dielectric layer 54 and the remaining isolation layer 42 in the recess 46 can be removed by utilizing a wet etching process.

Figure 8:
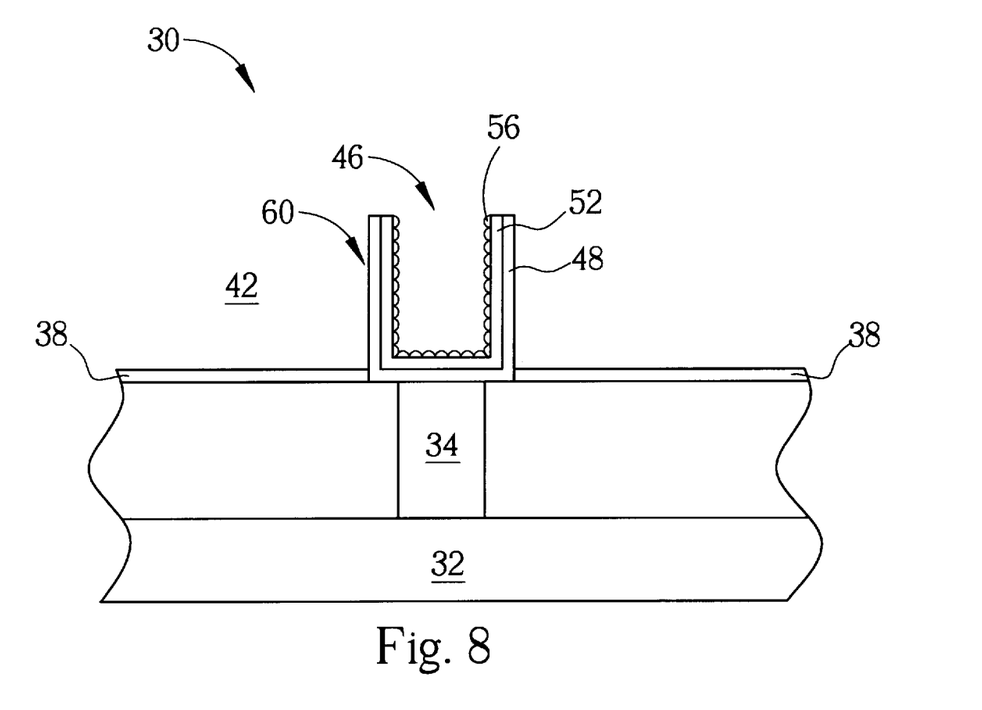

As shown in FIG. 8, a hemi-spherical grain (HSG) process is performed. Since the first doped amorphous silicon layer 48 and the second doped amorphous silicon layer 52 have high and low dopant concentrations respectively, a rough surface with a plurality of hemi-spherical grains 56 will form on the surface of the second doped amorphous silicon layer 52 in the recess 46, and no (or nearly no) hemi-spherical grains 56 will form on the surface of the doped amorphous silicon layer 48. As a result, the surface area of the lower storage node 56 is increased to further increase charge storage. An ion implantation process is used to implant dopants into the hemi-spherical grains 56 on the surface of the second doped amorphous silicon layer 52 in order to lower resistance. Finally, a heat treatment process is then performed to transform the second doped amorphous silicon layer 52 to polysilicon. The transformed doped amorphous silicon layer 52; together with the lower first doped amorphous silicon layer 48, forms the lower storage node 60 to complete the manufacturing process of the lower storage node 60.

Figure 9:
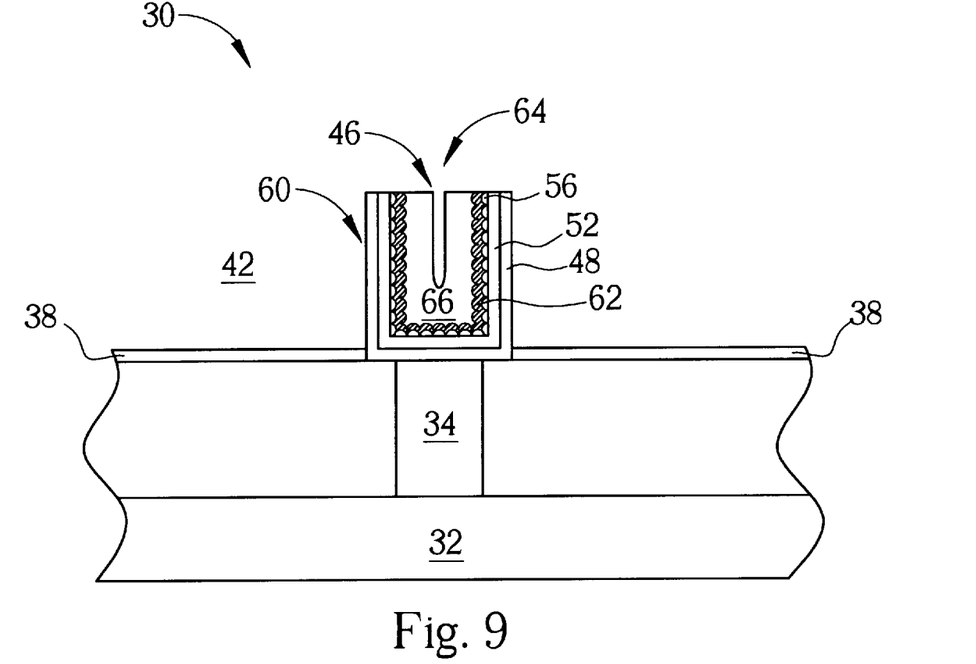
FIG. 9 to FIG. 10 are schematic diagrams of a finished capacitor according to the first embodiment of the present invention.
Figure 10:
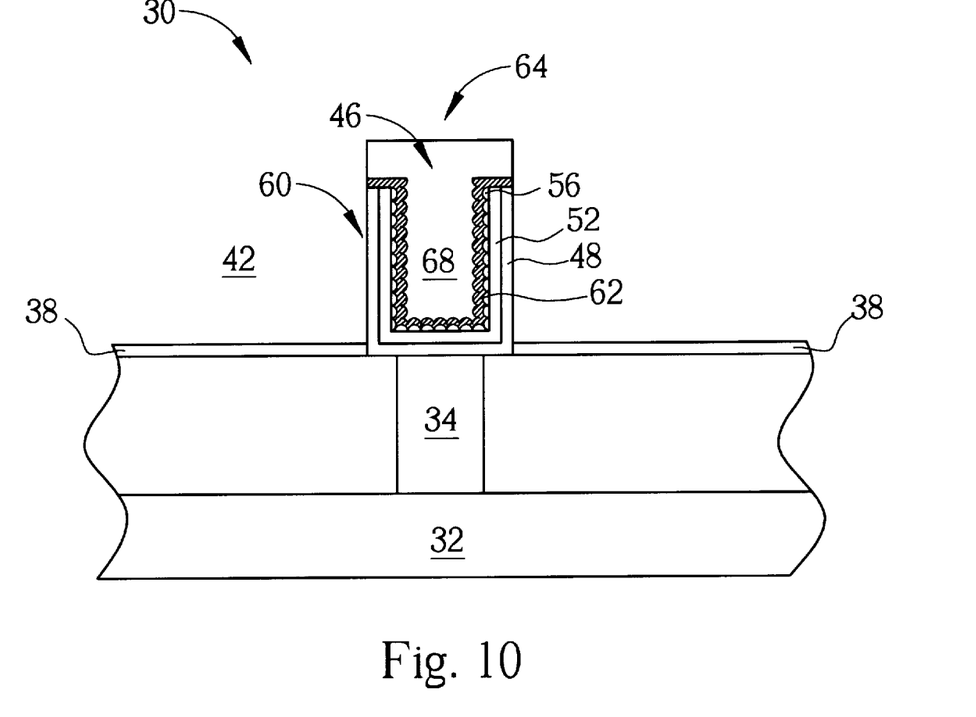

Please refer to FIG. 9 to FIG. 10. FIG. 9 to FIG. 10 are schematic diagram of a finished capacitor 64 according to the first embodiment of the present invention. As shown in FIG. 9, an ONO dielectric layer 62 is formed in the lower storage node 60 for use as a dielectric layer of the capacitor 64. Deposition and etching processes are then performed to form a field plate 66 of the capacitor. Furthermore, a field plate 68 (as shown in FIG. 10) of the capacitor 64 can be made by increasing the deposition time.

Second Embodiment

Figure 11:
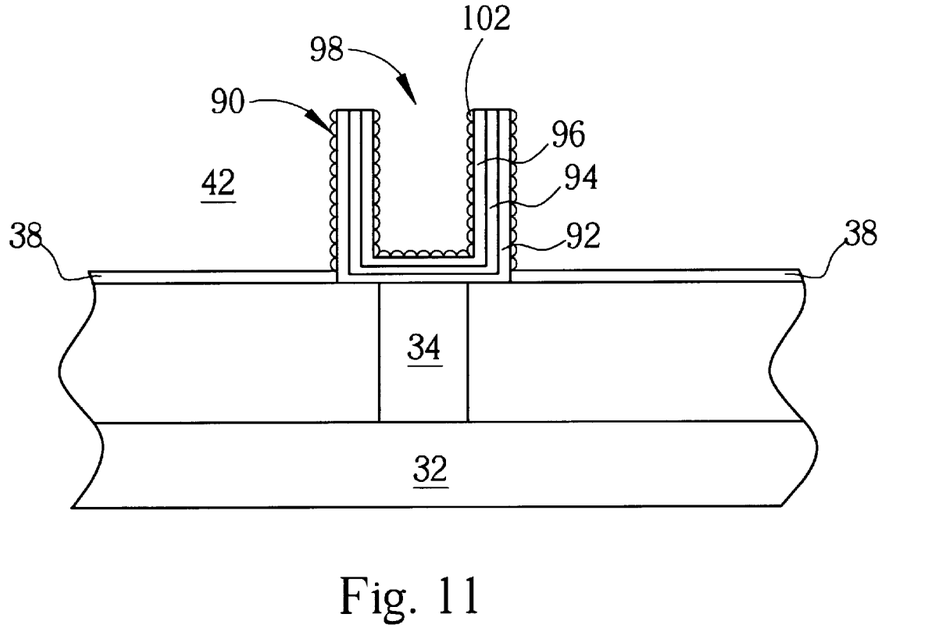
FIG. 11 is a schematic diagram of a lower storage node of a capacitor according to the second embodiment of the present invention.

In the second, preferred, embodiment of the present invention, the recess structure 46 made of the first doped amorphous silicon layer 48 and the second doped amorphous silicon layer 52 in the first preferred embodiment is replaced by a three-layered structure. Please refer to FIG. 11. FIG. 11 is a schematic diagram of a lower storage node 90 of a capacitor according to the second, preferred, embodiment of the present invention. As shown in FIG. 11, a recess 98 in the lower storage node 90 of the capacitor is made of a first doped amorphous silicon layer 92 with a low dopant concentration, a second doped amorphous silicon layer 94 with a high dopant concentration, and a third doped amorphous silicon layer 96 with a low dopant concentration. When afterwards performing the hemi-spherical grain (HSG) process, a rough surface with a plurality of hemi-spherical grains 102 will be formed on the surface of the first doped amorphous silicon layer 92 and the third doped amorphous silicon layer 96. Consequently, not only is the surface area of the lower storage node 90 further increased, but the charge storage capacity will also be increased.

Figure 12:
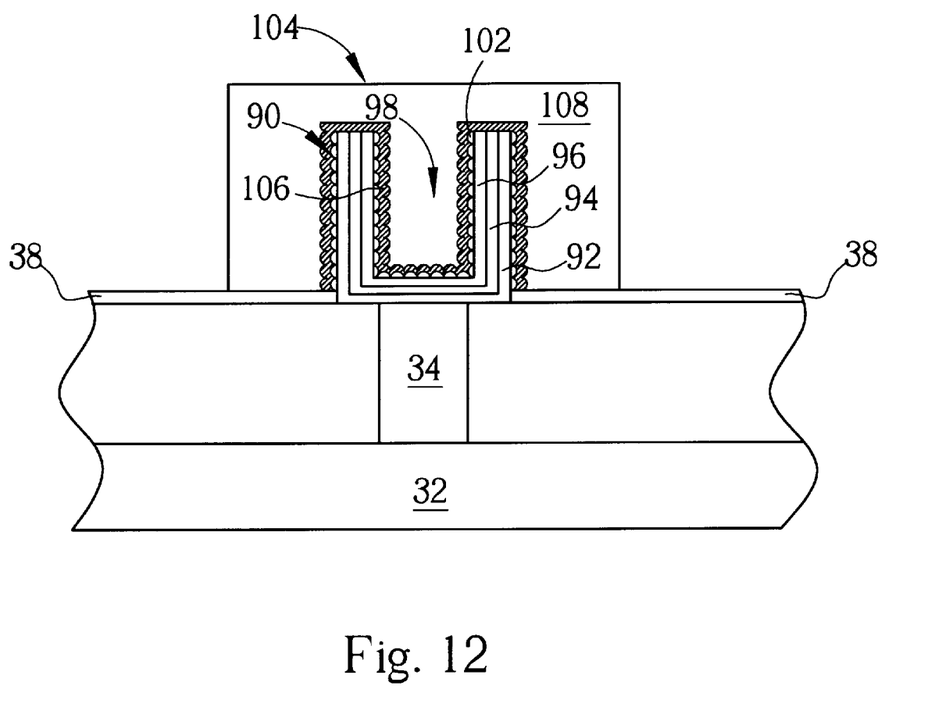
FIG. 12 is a schematic diagram of a finished capacitor according to the second embodiment of the present invention.

Please refer to FIG. 12. FIG. 12 is a schematic diagram of a finished capacitor 104 according to the second, preferred, embodiment of the present invention. As shown in FIG. 12, an ONO dielectric layer 106 is formed on the surface of the lower storage node 90 for use as a dielectric layer of the capacitor 104. Deposition and etch processes are then performed to form a field plate 108 of the capacitor. In the preferred embodiment, not only is the contact area of the lower storage node 90 obviously increased, but the resultant capacitance will also be increased.

Third Embodiment

Figure 13:
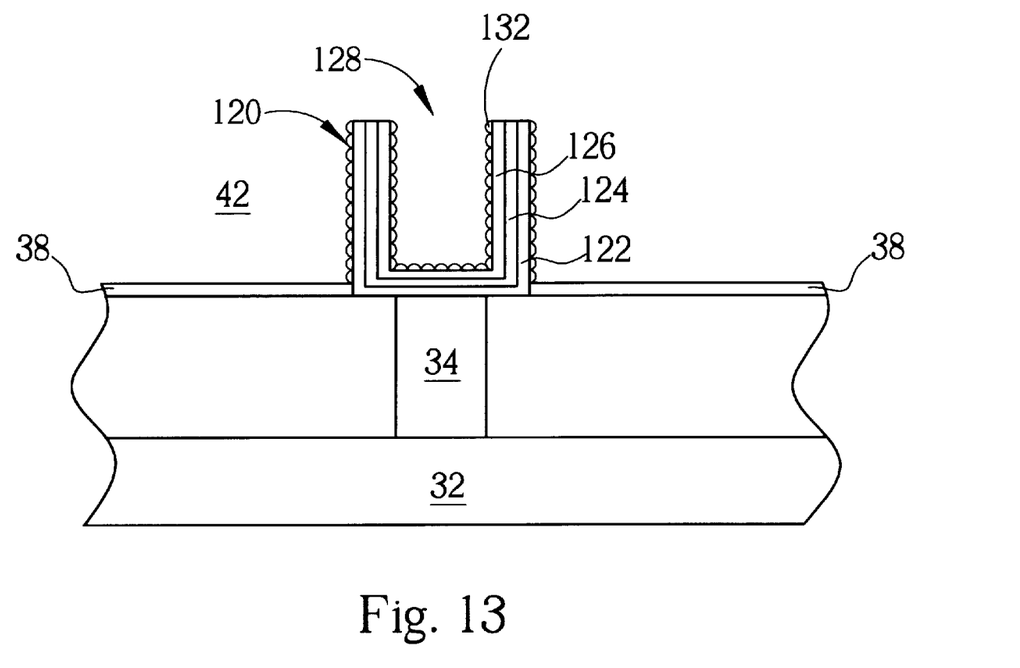
FIG. 13 is a schematic diagram of a lower storage node of a capacitor according to a third embodiment of the present invention.

In the third embodiment of the present invention, the three-layered structure of the recess is slightly changed. Please refer to FIG. 13. FIG. 13 is a schematic diagram of a lower storage node 120 of a capacitor according to the third embodiment to the present invention. As shown in FIG. 13, the structure of the recess 128 utilizes a first doped amorphous silicon layer 122 with a low dopant concentration, a first doped polysilicon layer 124 with a high dopant concentration, and a second doped amorphous silicon layer 126 with a low dopant concentration. When afterwards performing the hemi-spherical grain (HSG) process, a rough surface with a plurality of hemi-spherical grains 132 will be formed on the surface of the first doped amorphous silicon layer 122 and the second doped amorphous silicon layer 126. Again, not only is the surface area of the lower storage node 120 increased, but that resultant capacitance is also increased.

Figure 14:
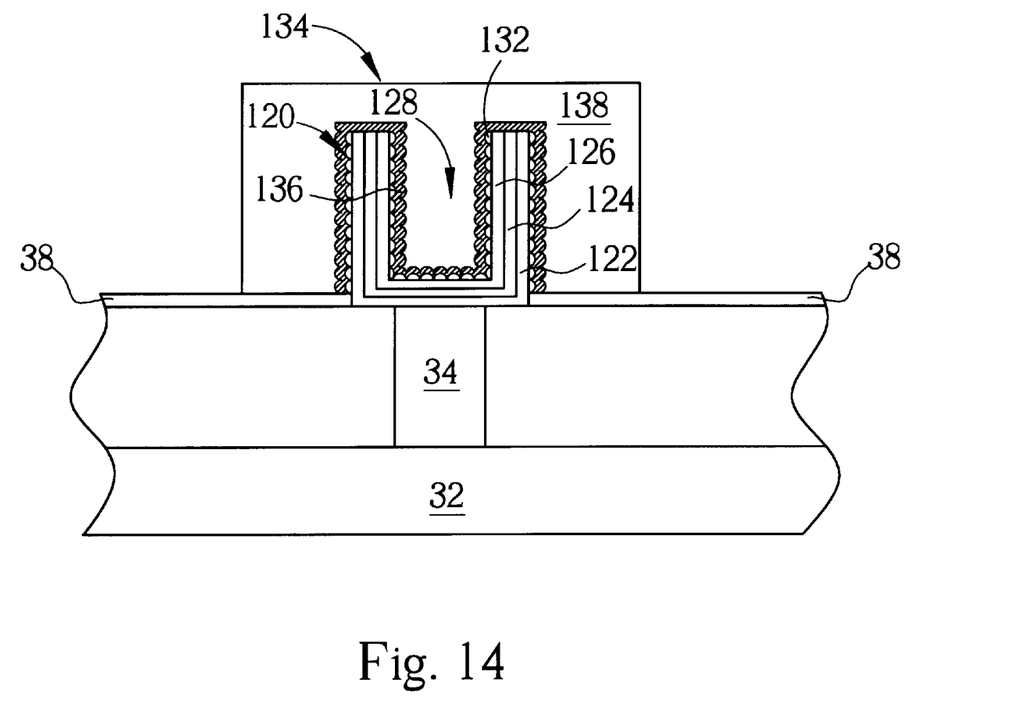
FIG. 14 is a schematic diagram of a finished capacitor according to the second embodiment of the present invention.

Please refer to FIG. 14. FIG. 14 is a schematic diagram of a finished capacitor 134 according to the third embodiment of the present invention. As shown in FIG. 14, an ONO dielectric layer 136 is formed on the surface of the lower storage node 120 for use as a dielectric layer of the capacitor 134. Deposition and etching processes are then performed to form a field plate 138 of the capacitor 134.

The present invention method for forming a lower storage node first involves the formation of a first doped amorphous silicon layer with a high dopant concentration, and forming a second doped amorphous silicon layer with a low dopant concentration, then performing a hemi-spherical grain process to the second doped amorphous silicon layer with a low dopant concentration. Dopants are also implanted into the hemi-spherical grains structure on the surface of the second doped amorphous silicon layer. The surface area of the lower storage node is thereby increased to double the original surface area. Also, in comparison with the prior art method, because the walls of the lower storage node in the present invention comprise a first doped amorphous silicon layer, their thickness is increased. Collapsing problems of the walls thus does not occur, which improves the total yield of the wafer process. Furthermore, the range of the field plate does not exceed the width of the recess. This shrinks the spacing between the capacitor and other devices. In preferred embodiment, the contact area for the lower storage node is significantly increased by making a three-layered structure, which thus further increases the total capacitance.

In contrast to the prior art method, the present invention method for forming the lower storage node first involves the formation of a first doped amorphous silicon layer with a high dopant concentration, and the forming a second doped amorphous silicon layer with a low dopant concentration. A rough surface with a plurality of hemi-spherical grains is then formed on the surface of the second doped amorphous silicon layer, which has a low dopant concentration. Dopants are then implanted into the hemi-spherical grains on the surface of the second doped amorphous silicon layer. Since the walls of the lower storage node in the present invention comprise a first doped amorphous silicon layer, their thickness is increased, and so the problems of collapse does not occur. This improves the total yield of the wafer process. Additionally, the range of the field plate does not exceed the width of the recess, and this shrinks the spacing between the capacitor and other devices. In other preferred embodiments, the contact area for the lower storage node is significantly increased by making a three-layered structure, which further increases the total capacitance.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for making a lower storage node of a capacitor on a semiconductor wafer, the method comprising:

providing a semiconductor substrate, a surface of the semiconductor substrate comprising an isolation layer;

performing a photo-etching-process (PEP) so as to form at least a trench reaching the surface of the semiconductor substrate through the isolation layer;

performing a two-step in-situ doping deposition process so as to form a first doped amorphous silicon ($\alpha$-Si) layer and a second doped amorphous silicon ($\alpha$-Si) layer on the isolation layer and on the surface of the trench in sequence, a doping concentration for the second doped amorphous silicon ($\alpha$-Si) layer being lower than a doping concentration for the first doped amorphous silicon ($\alpha$-Si) layer;

forming a dielectric layer on the surface of the semiconductor substrate, the dielectric layer filling the trench;

performing a planarization process so as to remove a portion of the second doped amorphous silicon ($\alpha$-Si) layer, the first doped amorphous silicon ($\alpha$-Si) layer and the dielectric layer on the surface of the isolation layer;

removing the dielectric layer and the isolation layer; and performing a hemi-spherical grain (HSG) process so as to form a rough surface having a plurality of hemi-spherical grains on the surface of the second doped amorphous silicon ($\alpha$-Si) layer inside the trench;

wherein no hemi-spherical grains are formed on the surface of the first doped amorphous silicon layer to shrink the spacing with other devices.

2. The method of claim 1 wherein a conductive device and an etch stop layer are further disposed on the surface of the silicon substrate.

3. The method of claim 2 wherein the conductive device is a node contact.

4. The method of claim 2 wherein the conductive device is a landing pad.

5. The method of claim 2 wherein the conductive device is a source or a drain of a metal-oxide semiconductor (MOS) transistor.

6. The method of claim 1 wherein a first step of the two-step in-situ doping deposition process is a phosphorous ion implantation process with a dopant concentration of 2.5 E20/cm$^3$ to 3.0 E20/cm$^3$, and a second step of the in-situ doping deposition process is a phosphorous ion implantation process with a dopant concentration from 1.2 E20/cm$^3$ to 1.7 E20/cm$^3$.

7. The method of claim 1 wherein the planarization process is a chemical mechanical polishing (CMP) process.

8. The method of claim 1 wherein the planarization process is an etch back process.

9. The method of claim 1 wherein after completing the hemi-spherical grain (HSG) process, the method further comprises a heat treatment process so as to transform the second doped amorphous silicon ($\alpha$-Si) layer with a hemi-spherical grain structure, and the first doped amorphous silicon($\alpha$-Si) layer, to a polysilicon structure.

* * * * *